US006492925B2

(12) United States Patent
Drentea

(10) Patent No.: US 6,492,925 B2
(45) Date of Patent: Dec. 10, 2002

(54) ULTRA-WIDE BAND (20 MHZ TO 5 GHZ) ANALOG TO DIGITAL SIGNAL PROCESSOR

(75) Inventor: Cornell Drentea, Tucson, AZ (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/837,134

(22) Filed: Apr. 18, 2001

(65) Prior Publication Data

US 2002/0154046 A1 Oct. 24, 2002

(51) Int. Cl.[7] ................................................. H03M 3/02
(52) U.S. Cl. ........................................ 341/143; 341/144
(58) Field of Search ................................. 341/143, 144; 375/219, 220, 222, 341, 262, 346; 455/140

(56) References Cited

U.S. PATENT DOCUMENTS

| | | | | |
|---|---|---|---|---|
| 6,034,990 A | * | 3/2000 | Kang .......................... | 375/219 |
| 6,236,674 B1 | * | 5/2001 | Morelli et al. ............... | 375/219 |
| 6,289,059 B1 | * | 9/2001 | Yamaguchi et al. ......... | 375/341 |
| 6,329,260 B1 | * | 12/2001 | DeJong et al. .............. | 438/318 |

\* cited by examiner

*Primary Examiner*—Peguy JeanPierre
*Assistant Examiner*—Joseph Lauture
(74) *Attorney, Agent, or Firm*—Colin M. Raufer; Leonard A. Alkov; Glenn H. Lenzen, Jr.

(57) ABSTRACT

An ultra-wide band general purpose analog to digital signal processor (200) covering the radio frequency range from 20 MHz to 5 GHz. The processor (200) includes a first circuit for shifting a frequency of an input signal, a second circuit for processing the input signal, and a third circuit for selectively bypassing the first circuit whereby the input signal is provided directly to the second circuit in a first mode of operation and to the second circuit via the first circuit in a second mode of operation. In the illustrative embodiment, the first circuit is a mixer (12) with a normalized mixing ratio of 0.8 to 0.9. The second circuit is a sigma-delta analog-to-digital converter (14). The third circuit is a switch (10) for passing the input signal directly to the second circuit if the input is 20 MHz to 2 GHz, or for passing the input signal to the first-circuit if the input is 2 GHz to 5 GHz. In the preferred embodiment, the switch (10), the mixer (12), and the sigma-delta converter (14) are disposed on a single application specific integrated circuit (ASIC) substrate (100).

17 Claims, 1 Drawing Sheet

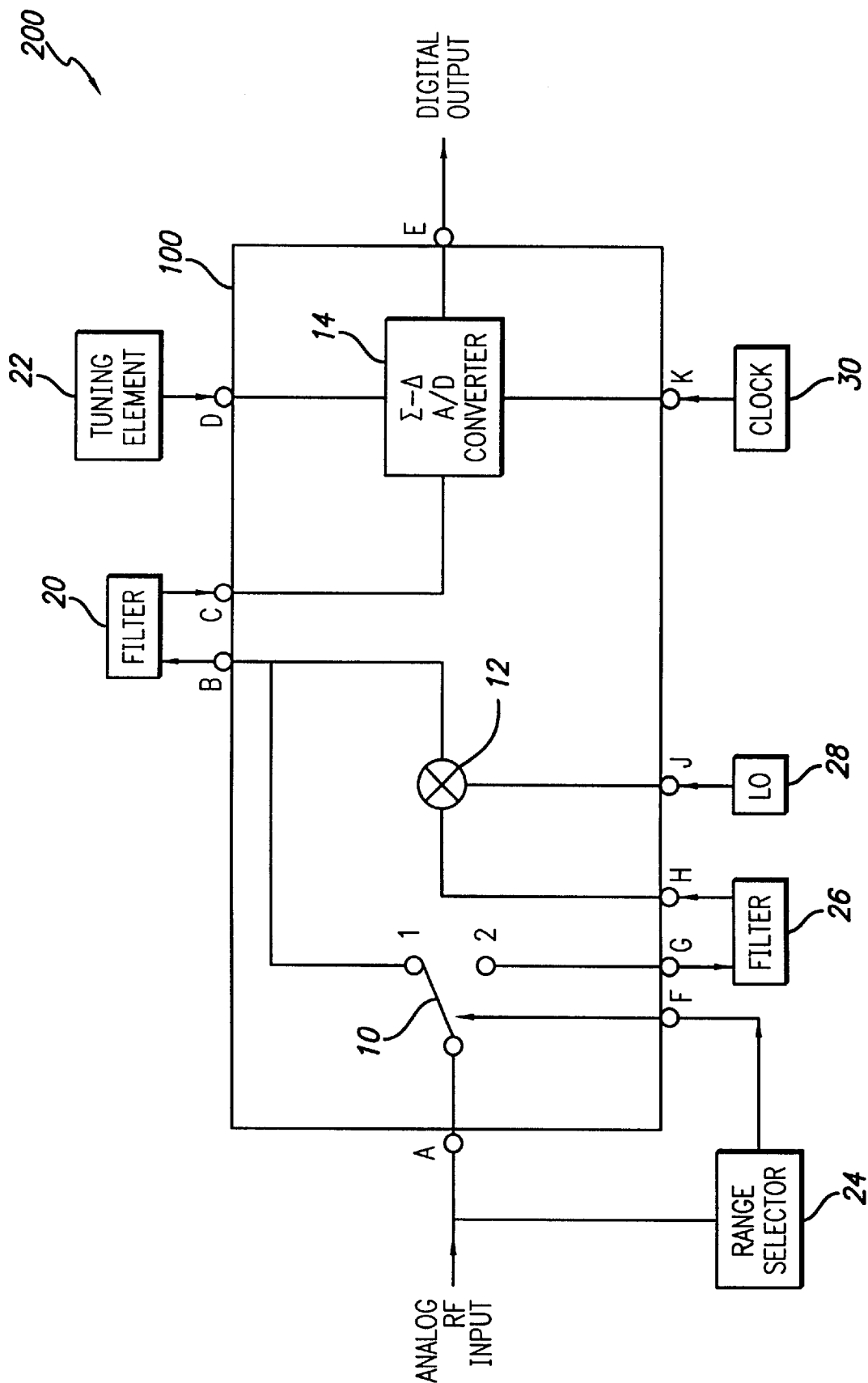

ULTRA-WIDE BAND (20 MHZ TO 5 GHZ) ANALOG TO DIGITAL SIGNAL PROCESSOR

BACKGROUND OF THE INVENTION

1. Field of the Invention

The present invention relates to electronic circuits and systems. More specifically, the present invention relates to analog to digital signal processors for use in communications receivers and radars.

2. Description of the Related Art

Radio frequency receivers should process the input signal as quickly as possible, i.e. as close to the antenna as possible, in order to obtain a high signal to noise ratio. Receivers generally have several stages of down-conversion, converting the RF (radio frequency) input signal to lower intermediate frequencies (IFs). The circuitry used to down-convert the signal, however, is subject to a number of limitations, including noise, drift, and dynamic range issues. It is therefore desirable to convert the signal to digital as close as possible to the antenna.

Currently, however, digital signal processing cannot be performed at the high (RF) frequencies received by the antenna. Digital signal processing is usually performed after several stages of down-conversion, at lower IFs (baseband to 100 MHz).

A digital signal processor is needed which can process the signal without as many intermediate stages of down-conversion, preferably at the first IF stage. In a typical radar system, for example, the first IF stage is upwards of 5 GHz. Currently, sigma-delta analog to digital converters can be used to process frequencies up to only 2 GHz. Sigma-delta converters higher than 2 GHz are not possible using currently available technology. Furthermore, these sigma-delta converters are conventionally narrow-band frequency specific integrated circuits with internally tuned electrical elements, such that different sigma-delta converters would need to be produced for use at different frequencies, dictating specific individual devices for each application. It would be more cost effective to produce a general purpose A/D converter which could be used for a wide range of frequencies.

Hence, a need exists in the art for an analog to digital signal processor designed for use at ultra-high frequencies greater than 2 GHz.

SUMMARY OF THE INVENTION

The need in the art is addressed by the ultra-wide band general purpose analog to digital (A/D) signal processor of the present invention. The processor includes a first circuit for shifting a frequency of an input signal, a second circuit for processing the input signal, and a third circuit for selectively bypassing the first circuit whereby the input signal is provided directly to the second circuit in a first mode of operation and to the second circuit via the first circuit in a second mode of operation.

In the illustrative embodiment, the first circuit is a mixer with a specific normalized mixing ratio of 0.8 to 0.9. The second circuit is a sigma-delta analog-to-digital converter. The third circuit is a switch for passing the input signal directly to the second circuit if the input is 20 MHz to 2 GHz or for passing the input signal to the first circuit if the input is 2 GHz to 5 GHz. In the preferred embodiment, the switch, the mixer, and the sigma-delta converter are disposed on a single application specific integrated circuit (ASIC) substrate.

In the illustrative embodiment, the processor further includes a range selector for controlling the switch, a local oscillator connected to the mixer, a first filter connected between the input signal and the second circuit in the first mode of operation or between the first circuit and the second circuit in the second mode of operation, a second filter connected between the input signal and the second circuit in the second mode of operation, a noise-canceling tuning element connected to the sigma-delta converter, and a clock connected to the sigma-delta converter. In the preferred embodiment, these elements are located external to the integrated circuit.

This implementation operates by taking advantage of the maximum frequency (2 GHz) achievable by today's state of the art sigma-delta technology, in combination with a specific superheterodyning frequency scheme, allowing almost spurious-free performance for the entire composite frequency range of interest (20 MHz to 5 GHz). Furthermore, the processor as described above does not require any internal tuning, as conventional sigma-delta converters do. Preconditioning and tuned noise canceling can be performed external to the general purpose integrated chip. The external elements can be easily adapted to various input frequencies, allowing the general purpose processor to be used as an AID converter in a variety to applications.

BRIEF DESCRIPTION OF THE DRAWINGS

The FIGURE is a block diagram of an ultra-wide band analog to digital signal processor constructed in accordance with the teachings of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The figure is a block diagram of an ultra-wide band analog to digital (A/D) signal processor 200 constructed in accordance with the teachings of the present invention. The processor includes a switch 10 for coupling the input signal to a sigma-delta analog to digital converter 14 in a normal mode of operation, or to a mixer 12 in a superheterodyne mode of operation. The output of the mixer 12 is input to the sigma-delta analog to digital converter 14. In the preferred embodiment, the switch 10, the mixer 12, and the sigma-delta analog to digital converter 14 are disposed on a single application specific integrated circuit (ASIC) substrate 100.

Those skilled in the art will appreciate that the switch 10 is not limited to this configuration. For instance, it can be placed at the output of the mixer 12, without departing from the scope of the present teachings.

The A/D converter 200 further includes a range selector 24 for controlling the switch 10, a filter 20 connected between the sigma-delta converter 14 and the output of the switch 10 in the normal mode or the output of the mixer 12 in the superheterodyne mode, a noise-canceling tuning element 22 connected to the sigma-delta converter 14, a clock 30 connected to the sigma-delta converter 14, a second filter 26 connected between the output of the switch 10 in the superheterodyne mode and the mixer 12, and a local oscillator (LO) 28 connected to the mixer 12. In the preferred embodiment, these elements are located external to the integrated circuit 100.

This implementation operates by taking advantage of the maximum frequency (2 GHz) achievable by today's state of the art sigma-delta technology, in combination with a specific superheterodyning frequency scheme, allowing almost spurious-free performance for the entire frequency range of interest (20 MHz to 5 GHz). Furthermore, the processor as described above does not require any internal tuning, as conventional sigma-delta converters do. Preconditioning and tuned noise canceling can be performed external to the general purpose integrated chip 100. The external elements can be easily adapted to various input frequencies, allowing the general purpose processor 100 to be used as an A/D converter in a variety of applications.

An analog RF signal is input to the integrated circuit 100 at a pin A connected to the switch 10. The switch 10 determines which of two possible modes of operation the circuit is in: 1) normal, for frequencies from 20 MHz to 2 GHz; or 2) superheterodyne, for frequencies from 2 GHz to 5 GHz.

The switch 10 is controlled by an external range selector 24 which is connected to the circuit by a pin F. The range selector can be implemented automatically (for instance, using a high-pass filter), manually, or with a jumper.

In the normal mode of operation, the input signal is between 20 MHz and 2 GHz, which can be processed by an up to 2 GHz general purpose sigma-delta converter.

The input signal from pin A passes through the switch 10, and is output through a pin B to an external filter 20 for preconditioning. The filter 20 is a fixed filter which corresponds with the frequency of the input signal.

The filtered signal is re-input to the integrated circuit 100 at a pin C, and applied to an up to 2 GHz general purpose sigma-delta analog to digital converter 14. Sigma-delta A/D converters are well known in the art. A sigma-delta A/D converter includes a sigma-delta modulator and a digital filter, and operates by oversampling the signal at several times the Nyquist frequency. As is known in the art, sigma-delta A/D converters require a frequency specific noise-canceling tuning element. Accordingly, a noise-canceling filter 22 is applied externally to the integrated circuit at a pin D and is chosen in accordance with the frequency of the input signal. The sigma-delta A/D converter 14 also requires a clock 30, which is supplied externally at a pin K.

Digital data is output from the sigma-delta A/D converter 14 at a pin E. The output signal is 1-bit serial digital data, which can then he converted to parallel digital words by a demultiplexer (DMUX).

In the superheterodyne mode of operation, additional coverage from 2 GHz to 5 GHz is provided by channeling the input signal into a specific superheterodyne processor with an intermediate frequency (IF) of 500 MHz±70 MHz. This unique frequency scheme was chosen because it allows spurious-free performance due to the normalized mixing ratio range of 0.8 to 0.9. This provides a very clean mixer output response for any RF input ranging from 2 GHz to 5 GHz.

When the circuit is in the superheterodyne mode, the input signal from pin A passes through the switch 10, and is output at a pin G to an external filter 26. The external filter 26 is a fixed filter chosen to correspond with the frequency of the input signal. The filtered signal is re-input to the integrated circuit 100 at a pin H, and applied to a mixer 12. A local oscillator (LO) 28 is applied to the mixer 12 at a pin J. The local oscillator 28 is chosen such that the output of the mixer 12 is at an intermediate frequency (IF) of 500 MHz±70 MHz.

Those skilled in the art will appreciate that this invention is not limited to this particular frequency scheme. For example, the mixer could also be used to up convert a signal to a frequency which could be processed by the sigma-delta converter.

The output of the mixer 12 is then output at pin B to an external filter 20. When operating in the superheterodyne mode, the external filter 20 should be an intermediate frequency (IF) filter ranging from 430 MHz to 570 MHz.

The filtered signal is re-input to the integrated circuit 100 at pin C, and applied to the sigma-delta analog to digital converter 14. A noise-canceling filter 22 is applied externally to the integrated circuit at pin D, and is chosen to correspond with the intermediate frequency. The sigma-delta A/D converter also requires a clock 30, which is supplied externally at pin K.

Digital data is output from the sigma-delta A/D converter 14 at a pin E. The output signal is 1-bit serial digital data, which is usually then converted to parallel digital words by a demultiplexer (DMUX).

Thus, the general purpose integrated circuit 100 can be used as an analog to digital converter for a variety of applications with frequencies ranging from 20 MHz to 5 GHz, by applying the appropriate external components. The invention takes advantage of the dual mode described to provide for continuous operation seamnlessly from one end of the range to the other.

Thus, the present invention has been described herein with reference to a particular embodiment for a particular application. Those having ordinary skill in the all and access to the present teachings will recognize additional modifications, applications and embodiments within the scope thereof.

It is therefore intended by the appended claims to cover any and all such applications, modifications and embodiments within the scope of the present invention. Accordingly,

What is claimed is:

1. A wide band signal processor comprising:
   first means for shifting a frequency of an input signal;
   second means for processing said input signal; and
   third means for selectively bypassing said first means whereby said input signal is provided directly to said second means in a first mode of operation and to said second means via said first means in a second mode of operation.

2. The invention of claim 1 wherein said first means is a down converter.

3. The invention of claim 2 wherein said down converter is a mixer.

4. The invention of claim 3 wherein said mixer has a normalized mixing ratio of 0.8 to 0.9.

5. The invention of claim 1 wherein said first means is an Lip converter.

6. The invention of claim 1 wherein said second means is a sigma-delta analog-to-digital converter.

7. The invention of claim 1 wherein said third means is a switch.

8. The invention of claim 7 wherein said switch is a single pole, double throw switch.

9. The invention of claim 8 wherein said pole is connected to an input terminal, a first throw is connected to said first means and a second throw is connected to said second means.

10. The invention of claim 8 wherein said pole is connected to said second means, a first throw is connected to an input terminal and a second throw is connected to said first means.

11. The invention of claim 7 wherein said switch is driven by a range selector.

12. The invention of claim 1 wherein said processor further includes a first filter connected between said input signal and said second means in said first mode of operation or between said first means and said second means in said second mode of operation.

13. The invention of claim 1 wherein said processor further includes a second filter connected between said input signal and said second means in said second mode of operation.

14. The invention of claim 1 wherein said processor further includes a noise-canceling tuning element connected to said second means.

15. The invention of claim 1 wherein said processor further includes a local oscillator connected to said first means.

16. A wide band signal processor comprising:
   a first circuit for shifting a frequency of an input signal;
   a second circuit for processing said input signal; and
   a third circuit for selectively bypassing said first circuit whereby said input signal is provided directly to said second circuit in a first mode of operation and to said second circuit via said first circuit in a second mode of operation.

17. A method for processing a wide band signal including the steps of:
   shifting a frequency of an input signal;
   processing said input signal; and
   selectively bypassing said frequency shifting step whereby said input signal is provided directly to said processing step in a first mode of operation and to said processing step after said frequency shifting step in a second mode of operation.

* * * * *